(12) United States Patent  
Marui et al.

(10) Patent No.: US 11,881,526 B2  
(45) Date of Patent: Jan. 23, 2024

(54) SEMICONDUCTOR DEVICE AND METHOD FOR MANUFACTURING SAME

(71) Applicants: Nissan Motor Co., Ltd., Kanagawa (JP); RENAULT S.A.S., Boulogne-Billancourt (FR)

(72) Inventors: Toshiharu Marui, Kanagawa (JP); Tetsuya Hayashi, Kanagawa (JP); Keiichiro Numakura, Kanagawa (JP); Wei Ni, Kanagawa (JP); Ryota Tanaka, Kanagawa (JP); Yuichi Iwasaki, Kanagawa (JP)

(73) Assignees: Nissan Motor Co., Ltd., Kanagawa (JP); RENAULT S.A.S., Boulogne-Billancourt (FR)

( * ) Notice: Subject to any disclaimer, the term of this patent is extended or adjusted under 35 U.S.C. 154(b) by 0 days.

(21) Appl. No.: 18/035,890

(22) PCT Filed: Nov. 9, 2020

(86) PCT No.: PCT/IB2020/000931  
§ 371 (c)(1),  
(2) Date: May 8, 2023

(87) PCT Pub. No.: WO2022/096908  
PCT Pub. Date: May 12, 2022

(65) Prior Publication Data  
US 2023/0411516 A1 Dec. 21, 2023

(51) Int. Cl.  
*H01L 29/78* (2006.01)  
*H01L 29/16* (2006.01)  
(Continued)

(52) U.S. Cl.  
CPC ...... *H01L 29/7816* (2013.01); *H01L 29/0878* (2013.01); *H01L 29/1608* (2013.01); *H01L 29/66681* (2013.01)

(58) Field of Classification Search  
CPC . H01L 21/046; H01L 21/7602; H01L 21/761; H01L 29/0634; H01L 29/0878;  
(Continued)

(56) References Cited

U.S. PATENT DOCUMENTS

2008/0191272 A1    8/2008   Takeda  
2009/0321827 A1   12/2009   Sunada et al.  
(Continued)

FOREIGN PATENT DOCUMENTS

CA     3025767 A1   12/2017  
CA     3033462 A1    2/2018  
(Continued)

*Primary Examiner* — Fazli Erdem  
(74) *Attorney, Agent, or Firm* — Osha Bergman Watanabe & Burton LLP

(57) ABSTRACT

A semiconductor device includes: a substrate; a source region formed on a main surface of the substrate; a well region electrically connected to the source region; a drift region in contact with the well region; a drain region in contact with the drift region; a first electrode electrically connected to the source region; a second electrode electrically connected to the drain region; a third electrode formed in contact with the source region, the well region, and the drift region through an insulating film; and a parasitic capacitance reduction region formed in contact with the source region and in contact with the third electrode through the insulating film and having a higher resistance value than that of the source region.

14 Claims, 10 Drawing Sheets

(51) Int. Cl.
*H01L 29/08* (2006.01)
*H01L 29/66* (2006.01)

(58) Field of Classification Search
CPC ............. H01L 29/1095; H01L 29/1608; H01L 29/4236; H01L 29/66068; H01L 29/66681; H01L 29/66704; H01L 29/7816; H01L 29/7825
USPC .......................................................... 257/343
See application file for complete search history.

(56) References Cited

U.S. PATENT DOCUMENTS

2016/0181371 A1 6/2016 Ni et al.
2019/0341486 A1 11/2019 Ni et al.
2020/0381522 A1 12/2020 Tanaka et al.

FOREIGN PATENT DOCUMENTS

| | | |
|---|---|---|
| CN | 101241935 A | 8/2008 |
| CN | 101615631 A | 12/2009 |
| CN | 109219869 A | 1/2019 |
| CN | 109564876 A | 4/2019 |
| DE | 102009023899 A1 | 7/2010 |
| EP | 3467869 A1 | 4/2019 |
| EP | 3499549 A1 | 6/2019 |
| JP | 2008-198676 A | 8/2008 |
| JP | 2010-010256 A | 1/2010 |
| KR | 2010-0002109 A | 1/2010 |
| KR | 10-2019-0011773 A | 2/2019 |
| KR | 10-2019-0025988 A | 3/2019 |
| TW | 201013790 A | 4/2010 |
| WO | 2015/008550 A1 | 1/2015 |
| WO | 2017/208301 A1 | 12/2017 |
| WO | 2018/029796 A1 | 2/2018 |

SEMICONDUCTOR DEVICE AND METHOD FOR MANUFACTURING SAME

TECHNICAL FIELD

The present invention relates to a semiconductor device and a method for manufacturing the semiconductor device.

BACKGROUND ART

Patent Literature 1 discloses a semiconductor device intended to improve withstand voltage. In the semiconductor device disclosed in Patent Literature 1, an n-type source region, a p-type well region, an n-type drift region, and an n-type drain region are formed by adding (doping) impurities to a low-doped or non-doped semiconductor substrate.

CITATION LIST

Patent Literature

Patent Literature 1: WO 2015/008550

SUMMARY OF INVENTION

Technical Problem

However, in the conventional semiconductor device described above, since the entire side surface of a gate electrode side of the n-type source region is in contact with the gate electrode, a gate-source capacitance $C_{GS}$ may be generated in the entire side surface of the gate electrode side of the n-type source region.

In view of the above-described issue, an object of the present invention is to provide a semiconductor device capable of reducing a gate-source capacitance $C_{GS}$ generated between a source electrode and a gate electrode, and a method for manufacturing the same.

Technical Solution

A semiconductor device according to one aspect of the present invention includes a first conductivity type source region formed on a main surface of a substrate, and a third electrode formed in contact with the first conductivity type source region, a second conductivity type well region, and a first conductivity type drift region through an insulating film. A parasitic capacitance reduction region is formed in contact with the first conductivity type source region and in contact with the third electrode through the insulating film, and a resistance value of the parasitic capacitance reduction region is made higher than that of the first conductivity type source region.

Advantageous Effects

The present invention makes it possible to reduce a gate-source capacitance $C_{GS}$ generated between a source electrode and a gate electrode.

DESCRIPTION OF EMBODIMENTS

Figure 1:
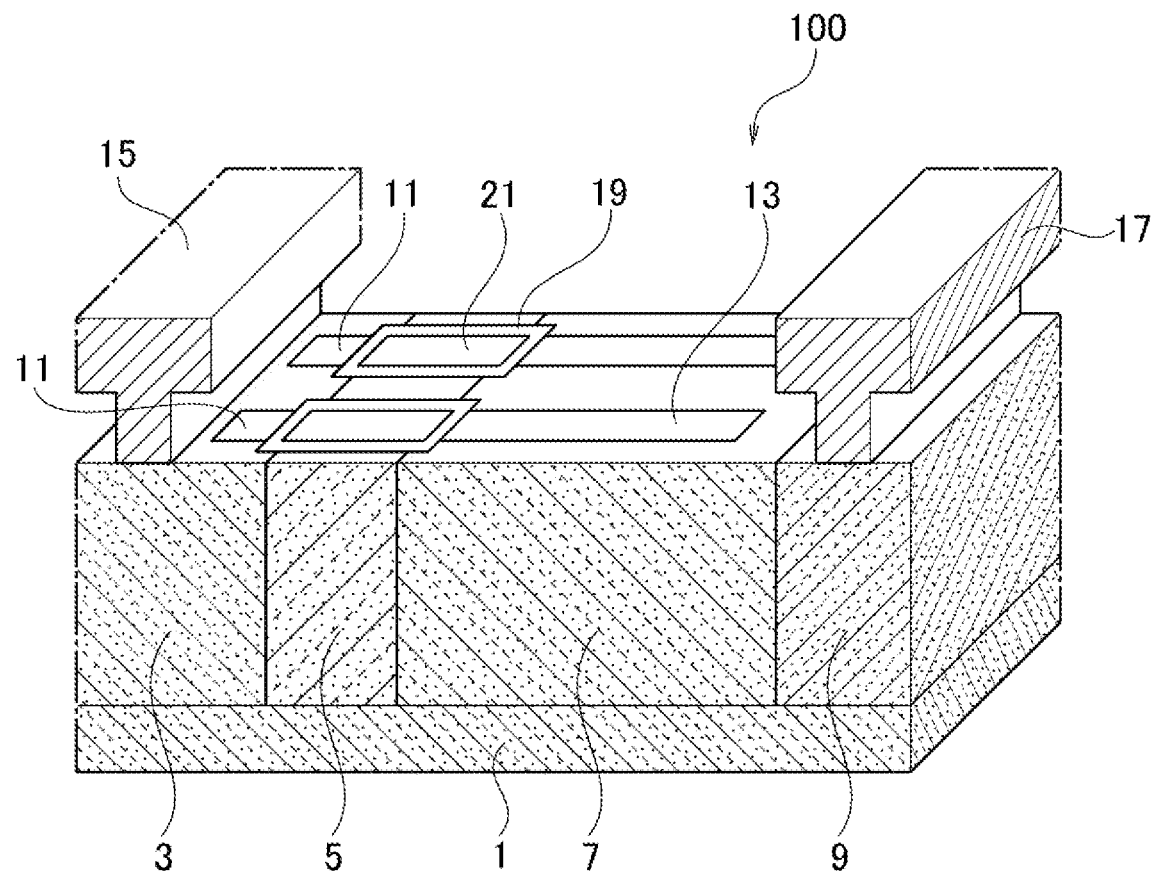
FIG. 1 is a cross-sectional perspective view illustrating a structure of a semiconductor device according to a first embodiment of the present invention.

Embodiments are described below with reference to the drawings. The same elements in the drawings are denoted by the same reference numerals, and descriptions thereof will be omitted. However, the drawings are schematic and include portions where a relationship between thickness and plane dimensions, a proportion of thickness of layers, and the like, differ from the actual ones. Moreover, the drawings include portions where a relationship and a proportion of dimensions differ therebetween.

In this description and the like, "electrically connected" includes a case of being connected through "something having some electrical action". There is no limitation here for "something having some electrical action" as long as it enables electrical signals to be transmitted and received between connection objects. For example, "something having some electrical action" includes electrodes, wiring, switching elements, resistive elements, inductors, capacitive elements, and other elements having various functions.

First Embodiment

[Structure of Semiconductor Device]

FIG. 1 is a diagram illustrating a structure of a semiconductor device according to the present embodiment. As illustrated in FIG. 1, a semiconductor device 100 according to the present embodiment is an n-type MOSFET and is a trench-gate structure lateral MOS device. This semiconductor device 100 includes a substrate 1, a first conductivity type source region 3, a second conductivity type well region 5, a first conductivity type drift region 7, a first conductivity type drain region 9, a parasitic capacitance reduction region 11, and a second conductivity type column region 13. The semiconductor device 100 also includes a source electrode (first electrode) 15 joined to the source region 3, a drain electrode (second electrode) 17 joined to the drain region 9, and a gate electrode (third electrode) 21 embedded in the well region 5 and the surrounding region through a gate insulating film 19.

Note that the first conductivity type and the second conductivity type are different from each other. That is, when the first conductivity type is p-type, the second conductivity type is n-type, and when the first conductivity type is n-type, the second conductivity type is p-type. The present embodiment describes a case where the first conductivity type is n-type and the second conductivity type is p-type.

The substrate 1 is an insulating semiconductor substrate. This makes it possible to simplify a device isolation process when multiple semiconductor devices are integrated on the same substrate 1. When a semiconductor device is mounted on a cooler, it is possible to omit an insulating substrate to be installed between the substrate 1 and the cooler. Here, an insulating substrate means a substrate having resistivity of several kΩ cm or more.

For example, an insulating silicon carbide substrate (SiC substrate) can be used for the substrate 1. Since SiC is a wide bandgap semiconductor having a small number of intrinsic carriers, it is easy to obtain high insulating properties and a semiconductor device having high withstand voltage can be realized. Although SiC has several polytypes (crystal polymorphs), a typical 4H SiC substrate can be used as the substrate 1. Using an SiC substrate for the substrate 1 makes it possible to enhance insulating properties and the thermal conductivity of the substrate 1. Thus, attaching the back of the substrate 1 directly to a cooling mechanism makes it possible to efficiently cool a semiconductor device. In this structure, the thermal conductivity of the SiC substrate is high, and thus it is possible to efficiently dissipate heat generated by a main current when a semiconductor device is in an on state.

The substrate 1 is not limited to a SiC substrate and may be a semiconductor substrate made from a semiconductor material having a wide band gap. Examples of the semiconductor material having a wide bandgap include GaN, diamond, ZnO, and AlGaN.

The source region 3 is formed on the main surface of the substrate 1 and is electrically connected to the well region 5. The n-type impurity concentration in the source region 3 is higher than that in the drift region 7 and is about $1\times10^{18}/cm^3$ to $1\times10^{21}/cm^3$, for example. The source electrode 15 is electrically connected to the surface of the source region 3, and the parasitic capacitance reduction region 11 is formed in part of the source region 3. The source region 3 is in contact with the gate electrode 21 through the gate insulating film 19.

The well region 5 is formed on the main surface of the substrate 1, is electrically connected to the source region 3, and is in contact with the drift region 7. The p-type impurity concentration in the well region 5 is about $1\times10^{15}/cm^3$ to $1\times10^{19}/cm^3$, for example. The gate electrode 21 is formed in part of the well region 5, and the well region is in contact with the gate electrode 21 through the gate insulating film 19. Note that the well region 5 is preferably formed from a wide bandgap semiconductor since it is possible to achieve both low on-resistance and a high dielectric breakdown electric field. When the substrate 1 and the well region 5 are formed from the same material, it is possible to prevent performance degradation, such as lattice mismatch, caused when different materials are used.

The drift region 7 is formed on the main surface of the substrate 1 and is in contact with the well region 5 and the drain region 9. The n-type impurity concentration in the drift region 7 is about $1\times10^{15}/cm^3$ to $1\times10^{19}/cm^3$, for example. The column region 13 is formed in part of the drift region 7, and the drift region 7 is in contact with the column region 13 and also with the gate electrode 21 through the gate insulating film 19. Note that the drift region 7 is preferably formed from a wide bandgap semiconductor since it is possible to achieve both low on-resistance and a high dielectric breakdown electric field. When the substrate 1 and the drift region 7 are formed from the same material, it is possible to prevent performance degradation, such as lattice mismatch, caused when different materials are used.

The drain region 9 is formed on the main surface of the substrate 1 and is in contact with the drift region 7. The n-type impurity concentration in the drain region 9 is higher than that in the drift region 7 and is about $1\times10^{18}/cm^3$ to $1\times10^{21}/cm^3$, for example. The drain electrode 17 is electrically connected to the surface of the drain region 9.

The parasitic capacitance reduction region 11 is in contact with the source region 3, is in contact with the gate electrode 21 through the gate insulating film 19, and is formed in such a manner that a resistance value thereof is higher than that of the source region 3. Specifically, the parasitic capacitance reduction region 11 is formed from the same material as the substrate 1. This causes the resistance value of the parasitic capacitance reduction region 11 to be higher than that of the source region 3 to which an n-type impurity is doped. Forming such a parasitic capacitance reduction region 11 enables a capacitance due to the parasitic capacitance reduction region 11 to be sandwiched between the source electrode 15 and the gate electrode 21, which makes it possible to reduce a gate-source capacitance $C_{GS}$. Note that the parasitic capacitance reduction region 11 is preferably formed from the surface of the source region 3 to the depth of the substrate 1 because the effect of reducing the gate-source capacitance $C_{GS}$ is greater when it is formed to a deeper position.

The column region 13 is formed in part of the drift region 7, is in contact with the drift region 7, and is in contact with the gate electrode 21 through the gate insulating film 19. The column region 13 is formed by doping a p-type impurity to the substrate 1 using ion implantation. The column region 13 is formed in this way, resulting in a super junction structure that provides high withstand voltage and low on-resistance characteristics.

The source electrode 15 is formed on the surface of the source region 3 and is electrically connected to the source region 3 and the well region 5.

The drain electrode 17 is formed on the surface of the drain region 9 and is electrically connected to the drift region 7 and the drain region 9.

The gate electrode 21 is formed in contact with the source region 3, the well region 5, the drift region 7, the parasitic capacitance reduction region 11 and the column region 13 through the gate insulating film 19. The gate electrode 21 is formed by forming a gate groove in contact with the source region 3, the well region 5, the drift region 7, the parasitic capacitance reduction region 11, and the column region 13, forming the gate insulating film 19 on the inner surface of the gate groove, and then depositing polysilicon.

[Operation of Semiconductor Device]

Next, an example of basic operation in the semiconductor device 100 according to the present embodiment will be described.

The semiconductor device 100 having the configuration illustrated in FIG. 1 functions as a transistor by controlling the potential of the gate electrode 21 with the potential of the source electrode 15 as a reference and a positive potential applied to the drain electrode 17. That is, when a voltage between the gate electrode 21 and the source electrode 15 is set to a predetermined threshold voltage or higher, an inversion layer is formed in a channel portion of the p-type well region 5 on the side of the gate electrode 21, resulting in an on state, which allows a current to flow from the drain electrode 17 to the source electrode 15.

In contrast, when a voltage between the gate electrode 21 and the source electrode 15 is set lower than a predetermined threshold voltage, the inversion layer disappears, resulting in an off state, which cuts off the current from the drain electrode 17 to the source electrode 15. Ideally, a pinch off state of the p-type column region 13 and the n-type drift region 7 results in a uniform rectangular distribution of the electric field distribution in the p-type column region 13 and the n-type drift region 7, which significantly reduces the maximum electric field and thus improves the withstand voltage.

Next, effects of the present invention will be described. It has been known that the gate-source capacitance $C_{GS}$ is significantly related to a time for an inversion layer to transit from an off state to an on state and from an off state to an on state.

Figure 2:
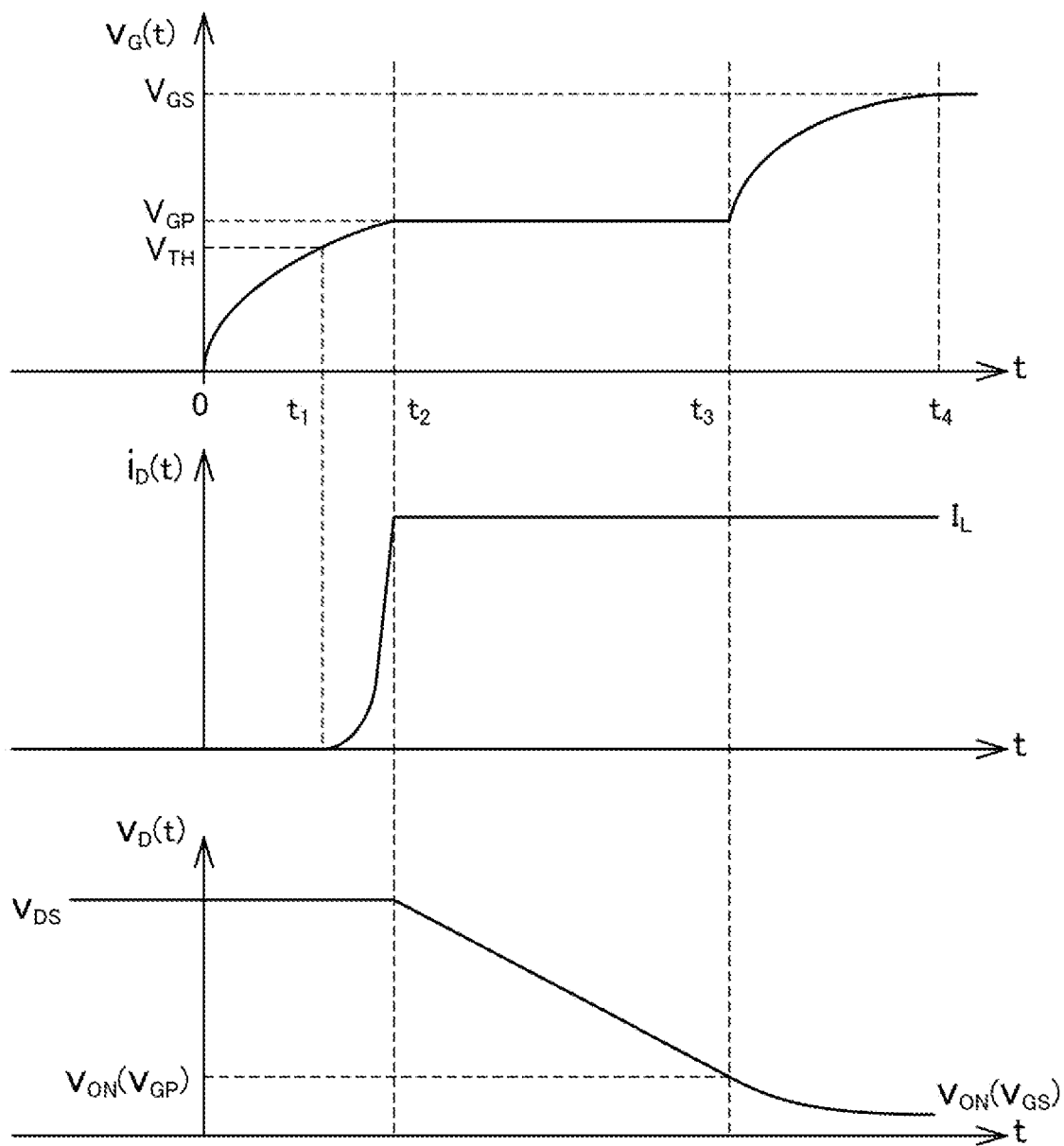
FIG. 2 is a diagram illustrating a relationship between a gate voltage, a drain current, and a drain voltage of the semiconductor device according to the first embodiment of the present invention.

FIG. 2 illustrates a relationship between a time $t_1$-$t_2$ taken for a gate voltage $V_G$ to change from a threshold voltage $V_{TH}$ to a plateau voltage $V_{GP}$ (a voltage at which a transistor is capable of delivering a controllable current to a load current), and the gate voltage $V_G$, a drain current $i_D$ and a drain voltage $V_D$.

Here, $t_1$ and $t_2$ are represented by the following equations (1) and (2).

[Math 1]

$$t_1 = R_G[C_{GS} + C_{GD}(V_{DS})]\ln\left(\frac{V_{GS}}{V_{GS} - V_{TH}}\right). \quad (1)$$

[Math 2]

$$t2 = R_G \cdot (C_{GS} + C_{GD}) \cdot \ln\left[\frac{V_{GS}}{V_{GS} - V_{GP}}\right]. \quad (2)$$

Since the gate-source capacitance $C_{GS}$ is sufficiently larger than the gate-drain capacitance $C_{GD}$ in equations (1) and (2), ignoring the term of $C_{GD}$, it can be seen that the switching time $t_1$-$t_2$ for the drain current $i_D$ is proportional to the value of the gate-source capacitance $C_{GS}$. Thus, if the gate-source capacitance $C_{GS}$ can be reduced, it is possible to shorten the switching time $t_1$-$t_2$ for the drain current $i_D$.

Figure 3A:
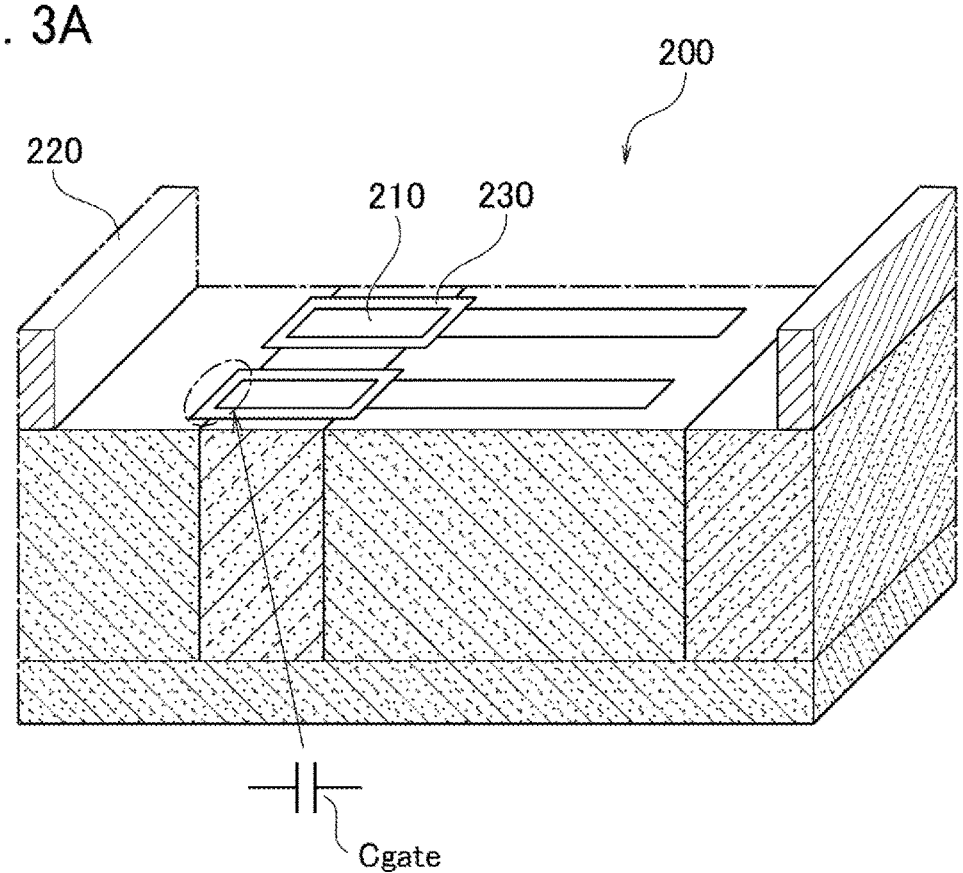
FIG. 3A is a diagram illustrating for effects of the semiconductor device according to the first embodiment of the present invention.
Figure 3B:
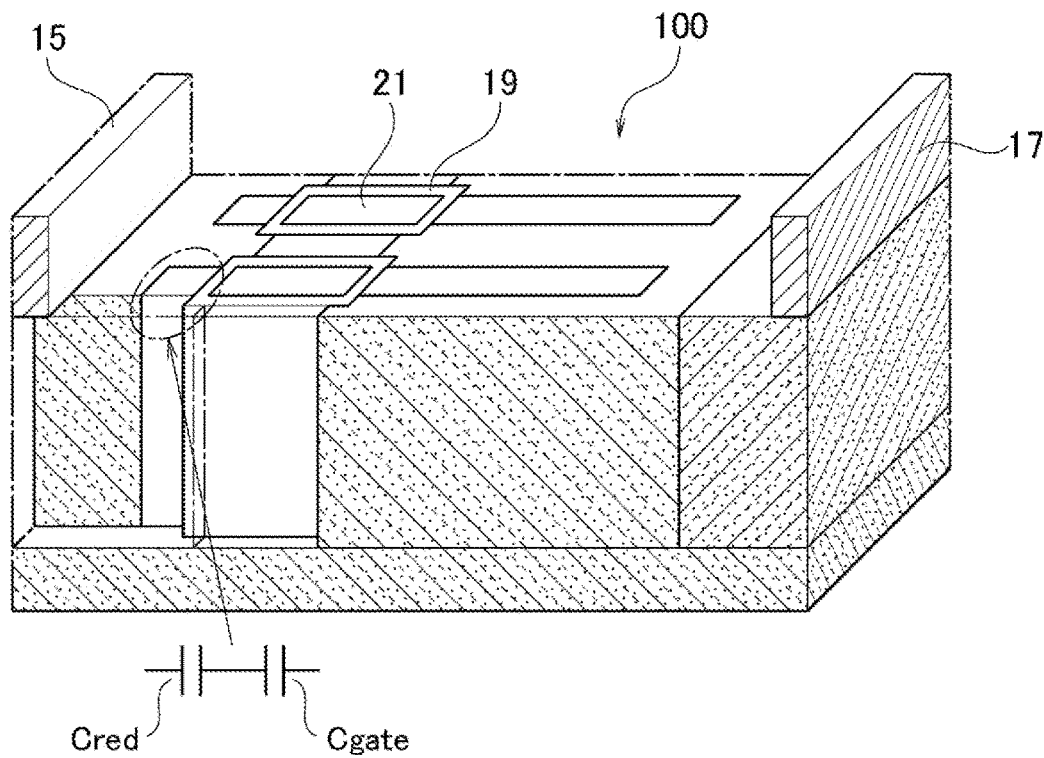
FIG. 3B is a diagram illustrating for effects of the semiconductor device according to the first embodiment of the present invention.

Next, a change in the gate-source capacitance $C_{GS}$ with and without the parasitic capacitance reduction region 11 will be described. FIG. 3A illustrates a structure of a conventional semiconductor device 200 without the parasitic capacitance reduction region 11. FIG. 3B illustrates a structure of the semiconductor device 100 according to the present embodiment provided with the parasitic capacitance reduction region 11.

As illustrated in FIG. 3A, in the conventional semiconductor device 200, a parasitic capacitance $C_{GS}$ of a portion between a gate electrode 210 and a source electrode 220 is determined only by a Cgate due to a gate insulating film 230. In contrast, as illustrated in FIG. 3B, in the semiconductor device 100 according to the present embodiment provided with the parasitic capacitance reduction region 11, a parasitic capacitance $C_{GS}$ between the gate electrode 21 and the source electrode 15 is a series connection of a Cgate due to the gate insulating film 19 and a Cred due to the parasitic capacitance reduction region 11.

Normally, the gate insulating film 19 has a thickness of several 10 nm, while the thickness of the parasitic capacitance reduction region 11 is 0.5 μm or more. Thus, the relationship of Cred<<Cgate is established, and the capacitance of the series connection of the Cred and Cgate is much smaller than that of the Cgate due to the gate insulating film 19, as in equation (3) below.

[Math 3]

$$\frac{Cred \times Cgate}{Cred + Cgate} << Cgate \quad (3)$$

That is, the gate-source capacitance $C_{GS}$ of the semiconductor device 100 according to the present embodiment is much smaller than that of the Cgate due to the gate insulating film 19.

Thus, when the width of the parasitic capacitance reduction region 11 between the source electrode 15 and the gate electrode 21 is larger than a predetermined value, i.e., sufficiently larger than the gate insulating film 19, the gate-source capacitance $C_{GS}$ becomes much smaller than the Cgate due to the gate insulating film 19.

Thus, in the semiconductor device 100 according to the present embodiment, the gate-source capacitance $C_{GS}$ is reduced by providing the parasitic capacitance reduction region 11 more than when only the gate insulating film 19 is formed. Since the switching time $t_1$-$t_2$ for the drain current $i_D$ is proportional to the value of the gate-source capacitance $C_{GS}$, it is possible to shorten the switching time $t_1$-$t_2$ of the semiconductor device 100 according to the present embodiment by reducing the gate-source capacitance $C_{GS}$.

Since a gap of 0.5 μm or more is usually provided between the gate electrode 21 and the source electrode 15 for process safety design, even if the parasitic capacitance reduction region 11 is provided between the gate electrode 21 and the source electrode 15, it will not affect the dimensions of the various parts of the semiconductor device 100.

[Method for Manufacturing Semiconductor Device]

Next, an example of a method for manufacturing the semiconductor device 100 according to the present embodiment will be described with reference to FIGS. 4A to 4H.

Figure 4A:
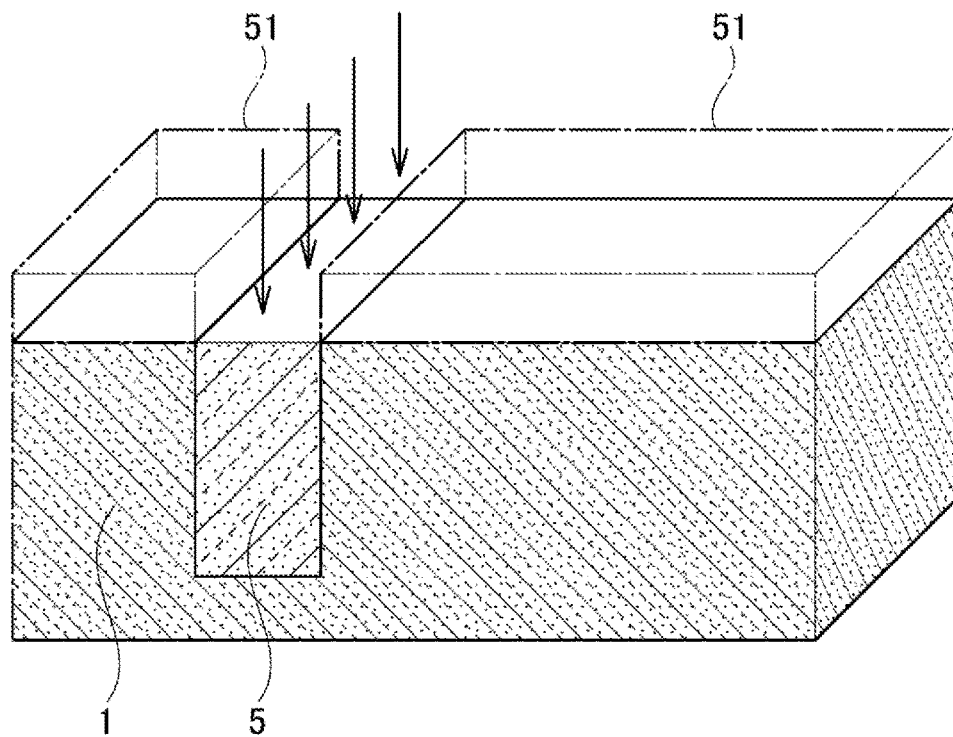
FIG. 4A is a schematic process diagram for illustrating a method for manufacturing the semiconductor device according to the first embodiment of the present invention (No. 1).

First, the substrate 1 having no impurities doped is prepared. Next, as illustrated in FIG. 4A, a mask material 51 formed on the substrate 1 is patterned to expose a region where the well region 5 is formed. Then, using the mask material 51 as a mask, ion implantation is performed to selectively dope a p-type impurity to the substrate 1 to form the well region 5.

A silicon oxide film can be used as a general mask material, and thermal CVD or plasma CVD can be used as a deposition method. Photolithography can be used as a method of patterning. That is, a mask material is etched using a patterned photoresist film as a mask. Wet etching using hydrofluoric acid, or dry etching, such as reactive ion etching, can be used as an etching method. After the mask material is etched, the photoresist film is removed using oxygen plasma or sulfuric acid. The mask material 51 is patterned in this manner.

Figure 4B:
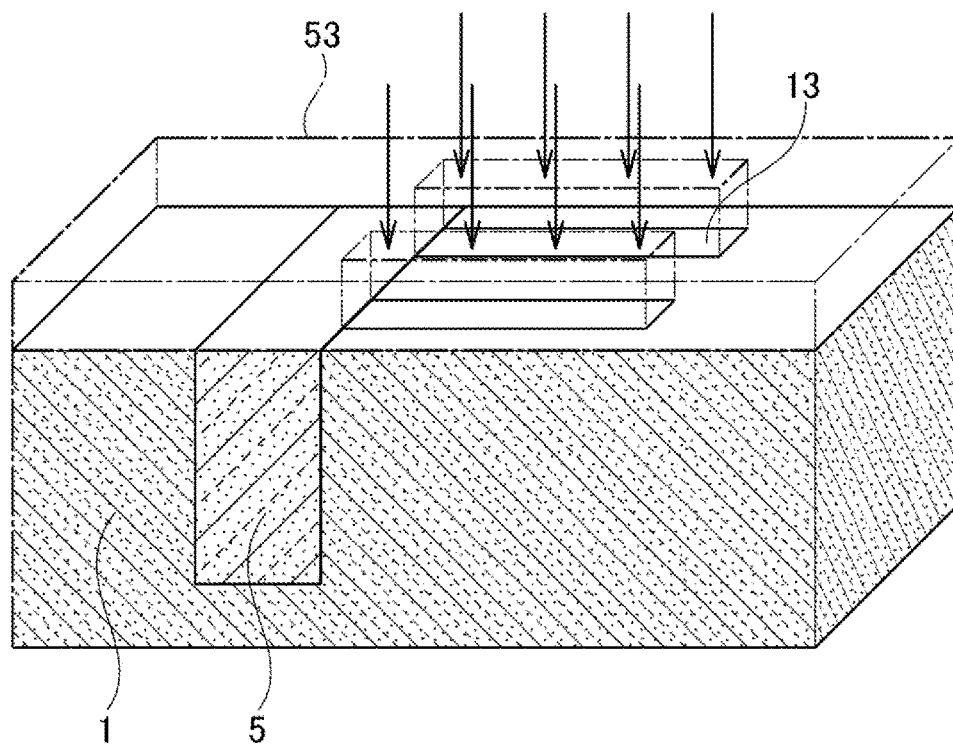
FIG. 4B is a schematic process diagram for illustrating the method for manufacturing the semiconductor device according to the first embodiment of the present invention (No. 2).

Next, as illustrated in FIG. 4B, a mask material 53 formed on the substrate 1 and the well region 5 is patterned to expose a region where column regions 13 are formed. Then, using the mask material 53 as a mask, ion implantation is performed to selectively dope a p-type impurity to the substrate 1 to form the column region 13.

Figure 4C:
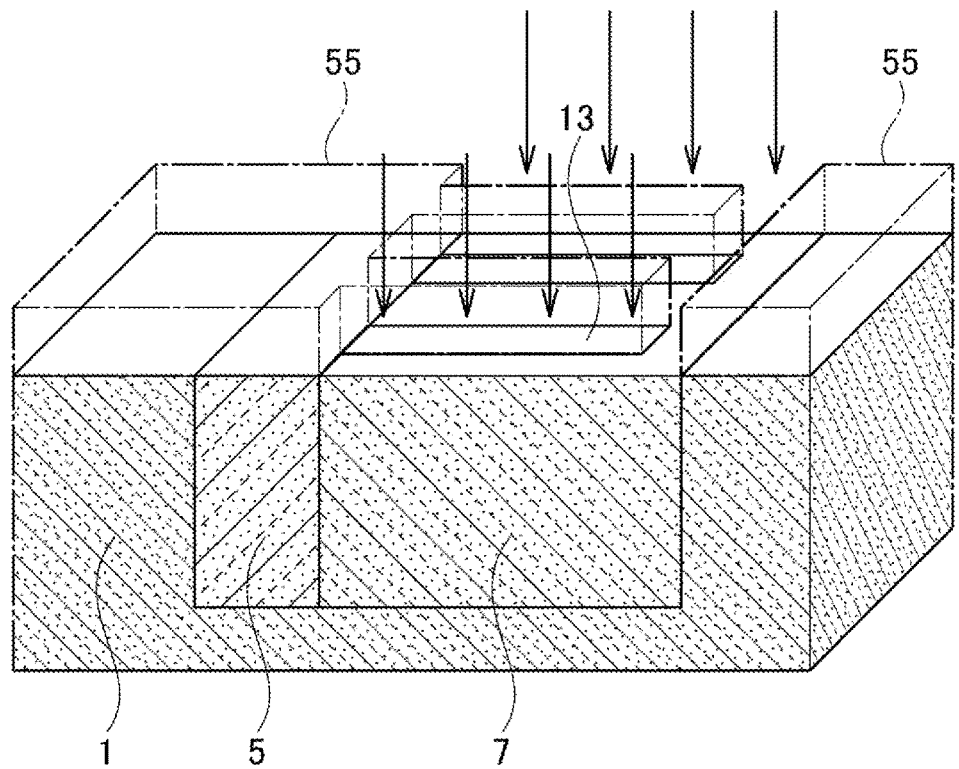
FIG. 4C is a schematic process diagram for illustrating the method for manufacturing the semiconductor device according to the first embodiment of the present invention (No. 3).

Next, as illustrated in FIG. 4C, a mask material 55 formed on the substrate 1, the well region 5, and the column regions 13 is patterned to expose a region where the drift region 7 is formed. Then, using the mask material 55 as a mask, ion implantation is performed to selectively dope an n-type impurity to the substrate 1 to form the drift region 7.

Figure 4D:
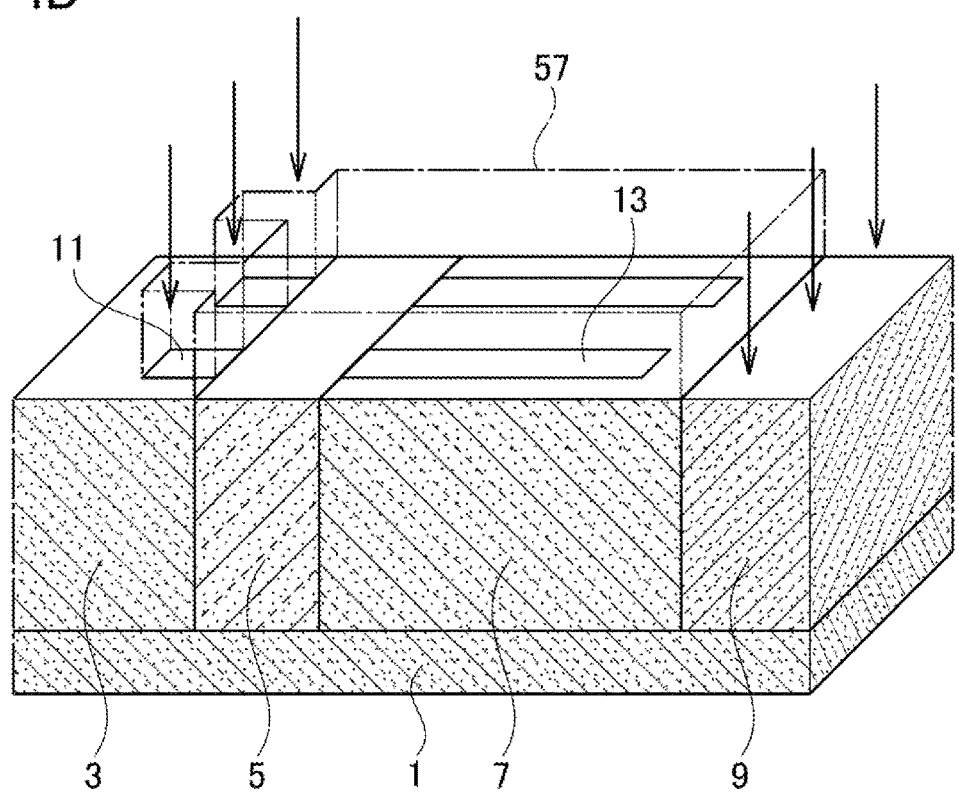
FIG. 4D is a schematic process diagram for illustrating the method for manufacturing the semiconductor device according to the first embodiment of the present invention (No. 4).

Next, as illustrated in FIG. 4D, a mask material 57 formed on the substrate 1, the well region 5, the column region 13, and the drift region 7 is patterned to expose a region where the source region 3 and the drain region 9 are formed. Then, using the mask material 57 as a mask, ion implantation is performed to selectively dope an n-type impurity to the substrate 1 to form the source regions 3 and the drain regions 9, which have high concentration. At this time, the mask material 57 is formed on part of a region where the source region 3 is formed, so that ion implantation is not performed and thus parasitic capacitance reduction regions 11 are formed therein. This causes the parasitic capacitance reduction regions 11 to be regions formed of the same material as the substrate 1. The parasitic capacitance reduction regions 11 are formed from the surface of the source region 3 to the depth of the substrate 1.

In the present embodiment, for example, nitrogen (N) can be used as the n-type impurity, and, for example, aluminum (Al) or boron (B) can be used as the p-type impurity. By performing ion implantation while the substrate is heated to about 600° C., it is possible to prevent the formation of crystal defects in the ion-implanted region.

Here, the impurity concentration in the n-type drift region 7 and the p-type column regions 13 is preferably $1\times10^{15}/cm'$ to $1\times10^{19}/cm^3$. A preferable condition for a combination of a donor concentration in the n-type drift region 7 and an acceptor concentration in the p-type column regions 13 is that a relationship in the following formula (4) holds. In equation (4), the donor concentration in the n-type drift region 7 is Nd, the acceptor concentration in the p-type column region 13 is Na, the width of the n-type drift region 7 is Wn, and the width of the p-type column region 13 is Wp.

$$Na \times Wp = Nd \times Wn \quad (4)$$

Ion-implanted impurities in the above-described processes can be activated through heat treatment. For example, heat treatment is performed at about 1700° C. in an argon atmosphere or a nitrogen atmosphere.

An ion implantation condition in which an impurity is doped at a high implantation energy to form a high concentration impurity region, and an ion implantation condition in which an impurity is doped at a low implantation energy to form a low concentration impurity region may be switched as appropriate. This makes it possible to continuously form a high concentration impurity region and a low concentration impurity region through one continuous ion implantation. For example, the drift region 7, which is a low concentration impurity region, and the source region 3, which is a high concentration impurity region, can be formed continuously.

It is possible to design the impurity concentration in the depth direction as desired by forming the drift region 7, the well region 5, the source region 3, and the drain region 9, which are part of the active region, while changing the depth impurity concentration by switching the ion implantation conditions in the middle of the ion implantation as described above. It is thus possible to reduce a concentration of electric fields and improve the maximum applied voltage of the semiconductor device.

Forming an n-type or p-type impurity region through ion implantation makes it possible to reduce manufacturing cost compared to forming it through epitaxial growth.

Figure 4E:
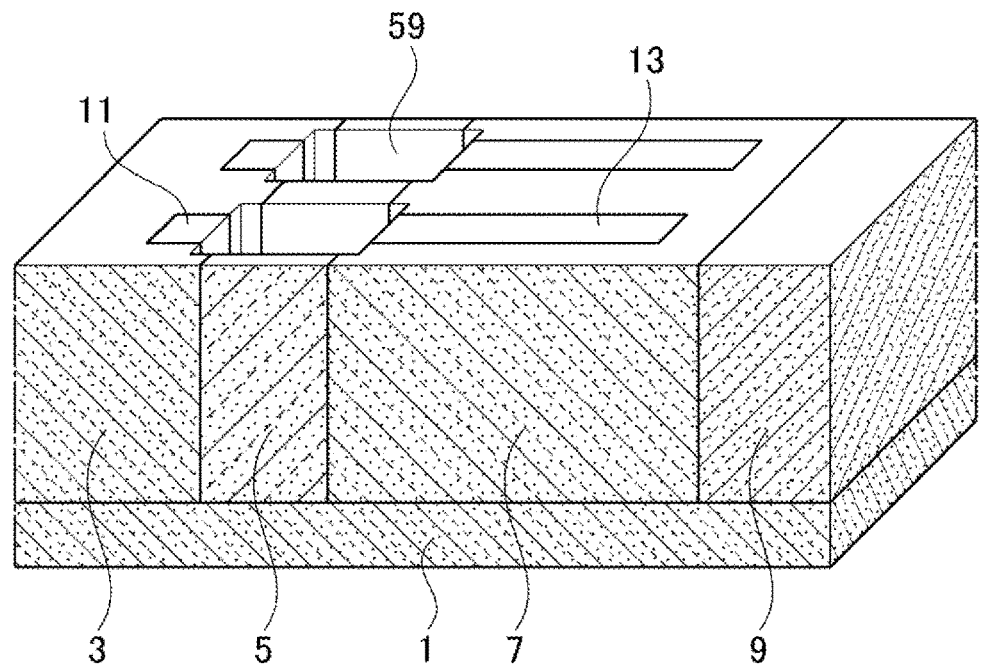
FIG. 4E is a schematic process diagram for illustrating the method for manufacturing the semiconductor device according to the first embodiment of the present invention (No. 5).

Next, as illustrated in FIG. 4E, dry etching is performed using a patterned mask material (not illustrated) as a mask. Thus, part of the source region 3, part of the parasitic capacitance reduction region 11, part of the well region 5, part of the drift region 7, and part of the column region 13 are selectively etched to form gate grooves 59 in which gate electrodes 21 are embedded. Consequently, the gate grooves 59 are formed at a position in contact with the source region 3, the well region 5, the drift region 7, the column regions 13, and the parasitic capacitance reduction regions 11.

Figure 4F:
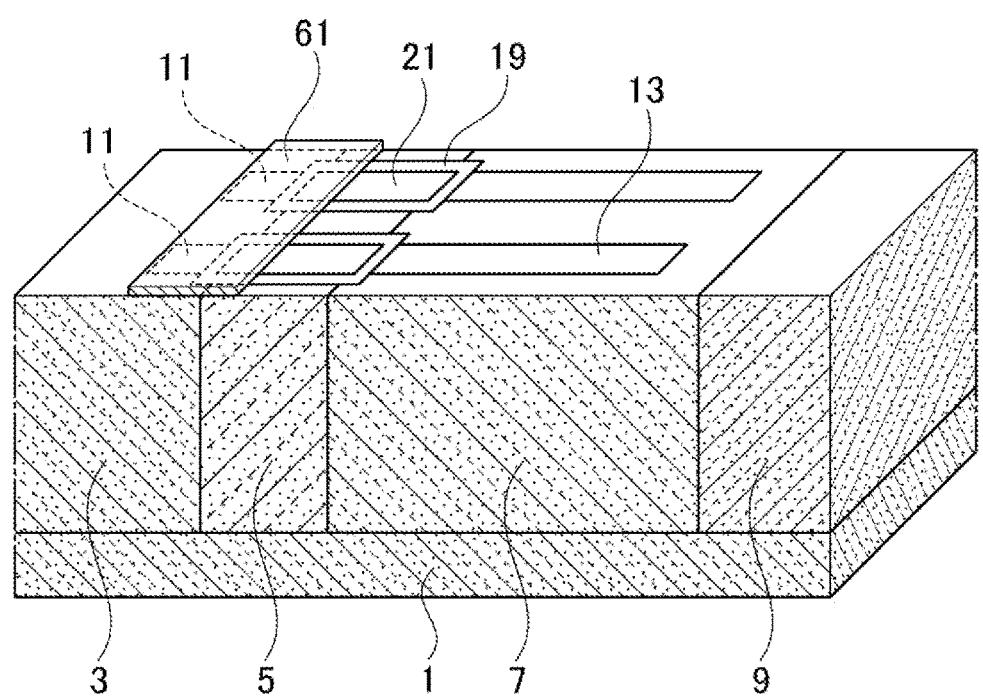
FIG. 4F is a schematic process diagram for illustrating the method for manufacturing the semiconductor device according to the first embodiment of the present invention (No. 6).

Next, as illustrated in FIG. 4F, gate insulating films 19 and the gate electrodes 21 are formed inside the gate grooves 59. The gate electrodes 21 are formed in contact with each of the source region 3, the parasitic capacitance reduction regions 11, the well region 5, the column regions 13, and the drift region 7 through the gate insulating films 19.

The gate insulating films 19 are formed on the inner wall surfaces of the gate grooves 59 and can be formed using a thermal oxidation method or a deposition method, for example. As an example, in the case of thermal oxidation, by heating the substrate to about 1100° C. under an oxygen atmosphere, a silicon oxide film is formed in every part where the substrate comes in contact with oxygen. However, a silicon nitride film may be used instead of a silicon oxide film, or a stack of a silicon oxide film and a silicon nitride film may be used. In the case of a silicon nitride film, isotropic etching can be performed through cleaning with thermal phosphoric acid at 160° C.

After the gate insulating films 19 are formed, annealing at about 1000° C. may be performed in an atmosphere of nitrogen, argon, $N_2O$, or the like so as to reduce an interface level at an interface between the well region 5 and the gate insulating films 19. Thermal oxidation under a direct NO or $N_2O$ atmosphere is also possible. In this case, the temperature is preferably 1100 to 1400° C. The thickness of the gate insulating films 19 is about several tens of nm.

The gate electrodes 21 are formed to be deposited inside the gate grooves 59 where the gate insulating films 19 are formed. As a material of the gate electrodes 21, a polysilicon film can be used, for example. The present embodiment describes a case where a polysilicon film is used for the gate electrodes 21.

As a deposition method of the polysilicon film, a low pressure CVD method or the like can be used. For example, the thickness of the polysilicon film to be deposited is set to a value greater than half the width of the gate grooves 59, and the gate grooves 59 are filled with the polysilicon film. Since the polysilicon film is formed from the inner wall surfaces of the gate grooves 59, it is possible to fill the gate grooves 59 with the polysilicon film through setting the thickness of the polysilicon film as described above. For example, when the width of the gate grooves 59 is 2 µm, a polysilicon film is formed in such a manner that the film thickness is greater than 1 µm. After the polysilicon film is deposited, an annealing process at 950° C. in phosphorus oxychloride ($POCl_3$) forms an n-type polysilicon film, which gives conductivity to the gate electrodes 21.

The polysilicon film is flattened through etching or the like. The etching method may be either isotropic etching or anisotropic selective etching. The etching amount is set in such a manner that the polysilicon film remains inside the gate grooves 59. For example, when a polysilicon film is deposited to a thickness of 1.5 µm for the gate grooves 59 having a width of 2 µm, the etching amount of the polysilicon film is set to 1.5 µm. However, there is no problem in the control of etching even with a few percent over-etching for the etching amount of 1.5 µm. Although description is made using n-type polysilicon, p-type polysilicon may be used. Other semiconductor materials may be used, or conductive materials, such as a metal material, may be used. For example, p-type polysilicon carbide, SiGe, or Al may be used.

Then, as illustrated in FIG. 4F, gate wiring 61 is formed to be arranged on the source region 3 and the well region 5 to connect the gate electrodes 21 to each other. The same polysilicon or metal as the gate electrodes 21 can be used for the gate wiring 61.

Figure 4G:
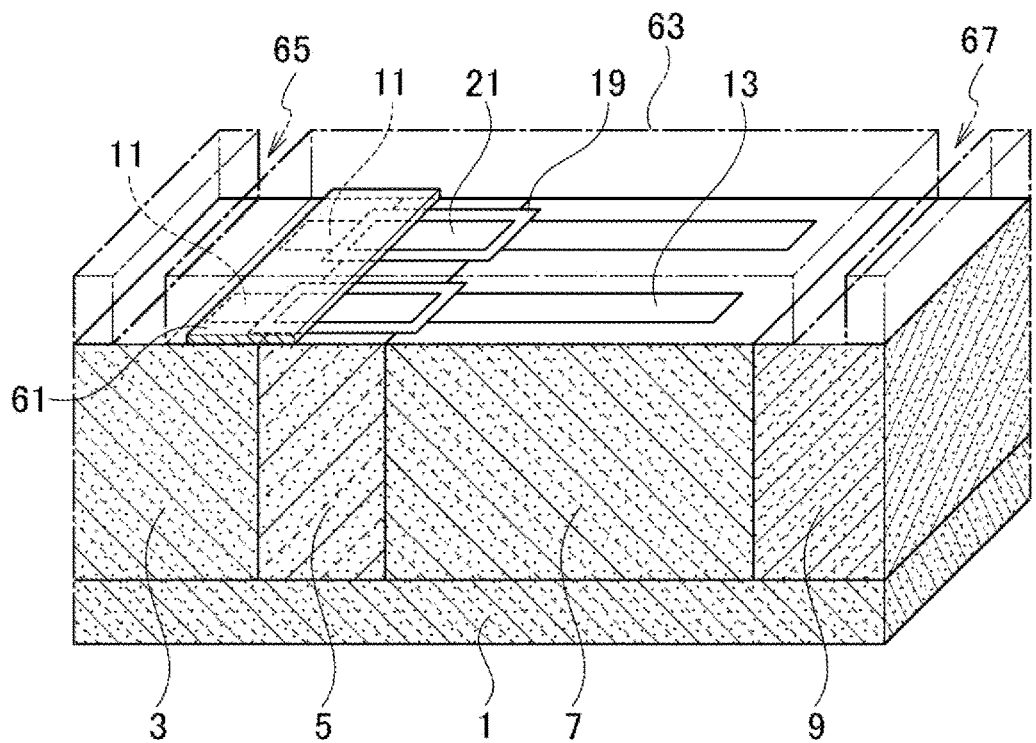
FIG. 4G is a schematic process diagram for illustrating the method for manufacturing the semiconductor device according to the first embodiment of the present invention (No. 7).

Then, as illustrated in FIG. 4G, an interlayer insulating film 63 is formed. A silicon oxide film can be used for the interlayer insulating film 63, for example. As a deposition method of the silicon oxide film, thermal CVD or plasma CVD can be used. A silicon nitride film may also be used for the interlayer insulating film 63.

Then, using a patterned photoresist film (not illustrated) as a mask, the interlayer insulating film 63 is selectively etched to form a source electrode contact hole 65 in such a manner that the upper surface of the source region 3 is exposed. Similarly, a drain electrode contact hole 67 is formed in such a manner that the upper surface of the drain region 9 is exposed. For example, wet etching using hydrofluoric acid, or dry etching, such as reactive ion etching, is used as an etching method.

Figure 4H:
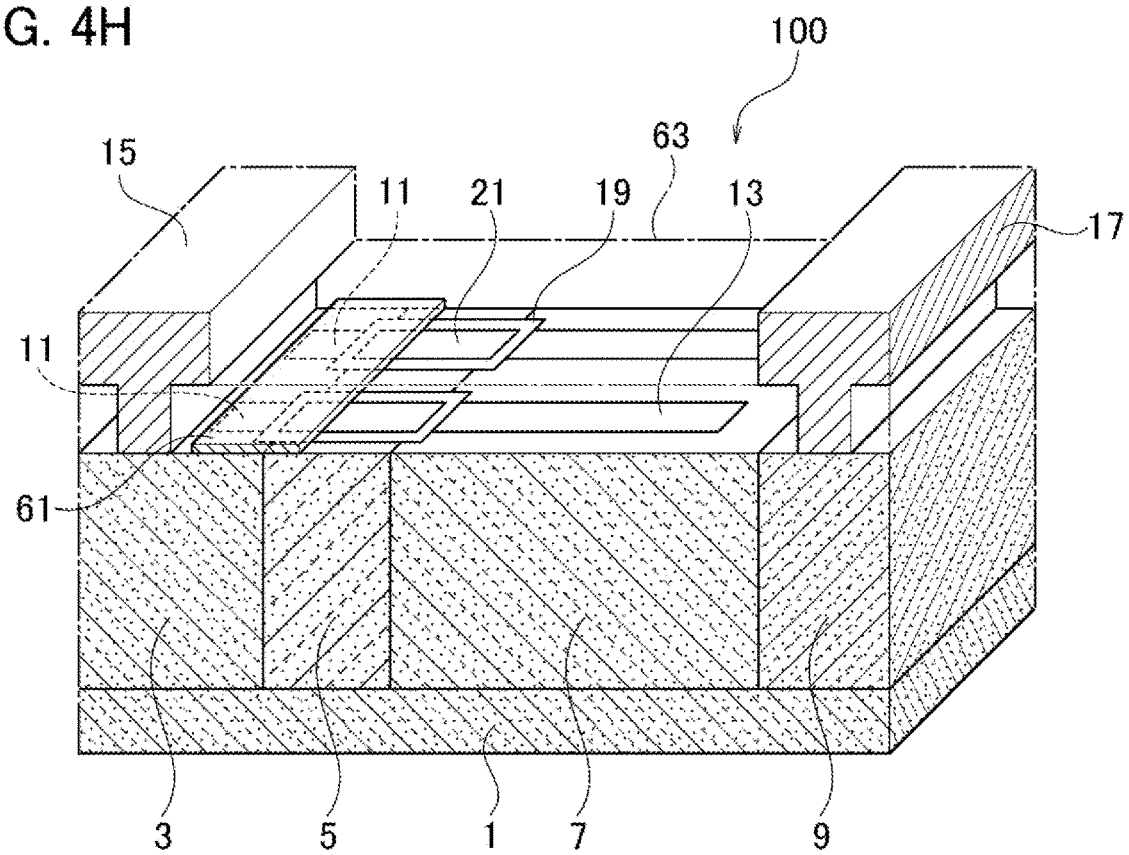
FIG. 4H is a schematic process diagram for illustrating the method for manufacturing the semiconductor device according to the first embodiment of the present invention (No. 8).

Then, as illustrated in FIG. 4H, an electrode film deposited to fill the contact holes 65 and 67 is patterned to form the source electrode 15 and the drain electrode 17. As the materials of the source electrode 15 and the drain electrode 17, metal materials used for metal wiring, such as titanium (Ti), nickel (Ni), and molybdenum (Mo), can be suitably used. A stacked film of titanium/nickel/silver (Ti/Ni/Ag) and the like may also be used for the source electrode 15 and the drain electrode 17. The source electrode 15 and the drain electrode 17 are formed by depositing a metal material on the entire surface using sputtering or electron beam (EB) deposition and then etching the metal material. The source electrode 15 and the drain electrode 17 may also be formed by filling contact holes with a metal material through a plating process. When the source electrode 15 and the drain electrode 17 are thus formed, the semiconductor device 100 according to the present embodiment is completed.

Effects of First Embodiment

As described above in detail, in the semiconductor device 100 according to the present embodiment, the parasitic capacitance reduction regions 11 are formed in contact with the source region 3 and in contact with the gate electrodes 21 through the gate insulating films 19, and the resistance value of the parasitic capacitance reduction regions 11 is made higher than that of the source region 3. Thus, it is possible to reduce the gate-source capacitance $C_{GS}$ generated between the source electrode 15 and the gate electrodes 21. Then, reducing the gate-source capacitance $C_{GS}$ enables the switching time of the semiconductor device 100 to be shortened.

In the semiconductor device 100 according to the present embodiment, the parasitic capacitance reduction regions 11 are formed from the same material as the substrate 1. This enables the parasitic capacitance reduction regions 11 to be formed simultaneously through masking when the source region 3 is formed, which makes it possible to prevent the increase of the manufacturing process.

In the semiconductor device 100 according to the present embodiment, the substrate 1 is an insulation substrate. Thus, when the semiconductor device 100 is mounted on a cooler or the like, the use of a separate insulating substrate can be omitted.

In the semiconductor device 100 according to the present embodiment, the parasitic capacitance reduction regions 11 are formed from the surface of the source region 3 to the depth of the substrate 1. This makes it possible to increase the effect of reducing the gate-source capacitance $C_{GS}$ compared to the case where the depth of the parasitic capacitance reduction regions 11 is shallow.

In the semiconductor device 100 according to the present embodiment, the substrate 1 is formed from silicon carbide. It is thus possible to enhance cooling performance by utilizing high thermal conductivity characteristics of silicon carbide.

In the semiconductor device 100 according to the present embodiment, the well region 5 and the drift region 7 are formed from a wide bandgap semiconductor. This makes it possible to achieve both low on-resistance and high dielectric breakdown electric field.

In the semiconductor device 100 according to the present embodiment, the substrate 1 and the drift region 7 are formed from the same material. This prevents performance degradation, such as lattice mismatch, caused when different materials are used.

In the method for manufacturing the semiconductor device according to the present embodiment, impurities are doped to the substrate 1 through ion implantation to form the source region 3, the well region 5, the drift region 7, and the drain region 9. This makes it possible to greatly reduce the manufacturing cost compared to forming it through epitaxial growth.

In the method for manufacturing the semiconductor device according to the present embodiment, the source region 3, the well region 5, the drift region 7, and the drain region 9 are formed through changing the impurity concentration in the depth direction during ion implantation. This makes it possible to design the doping concentration in the depth direction as desired and to further improve the maximum applied voltage.

In the method for manufacturing the semiconductor device according to the present embodiment, when the source region 3 is formed using ion implantation, part of a region where the source region 3 is formed is masked and thus the parasitic capacitance reduction regions 11 are formed. This enables the source region 3 and the parasitic capacitance reduction regions 11 to be made simultaneously, thereby preventing the increase of the manufacturing process.

Second Embodiment

A second embodiment to which the present invention is applied will be described below with reference to the drawings. The same elements in the drawings are denoted by the same reference numerals, and descriptions thereof will be omitted.

[Structure of Semiconductor Device]

Figure 5:
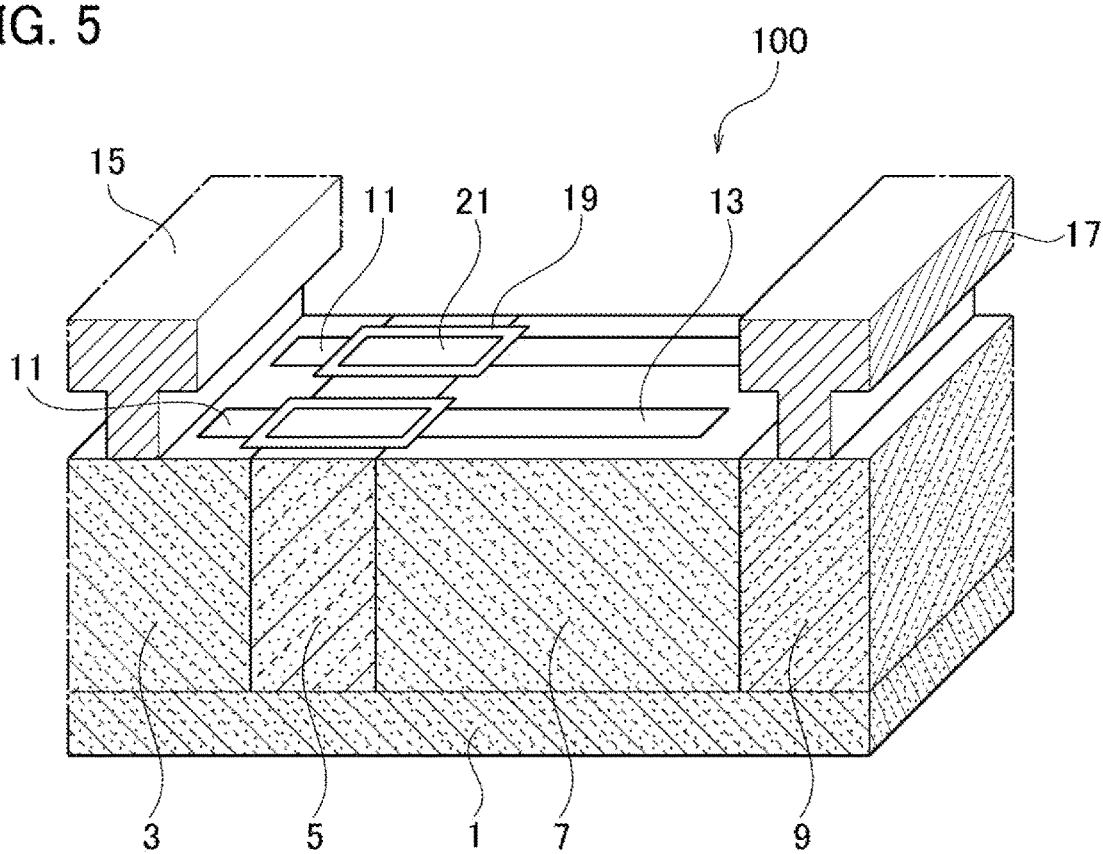
FIG. 5 is a cross-sectional perspective view illustrating a structure of a semiconductor device according to a second embodiment of the present invention.

FIG. 5 is a diagram illustrating a structure of a semiconductor device according to the present embodiment. As illustrated in FIG. 5, the semiconductor device 100 according to the present embodiment differs from the first embodiment in that the parasitic capacitance reduction regions 11 are formed from a p-type semiconductor material having a lower impurity concentration than that of the source region 3. The parasitic capacitance reduction regions 11 may be formed from an n-type semiconductor material having a lower impurity concentration than that of the source region 3.

As described above, the parasitic capacitance reduction regions 11 are formed from an n-type or p-type semiconductor material having a lower impurity concentration than that of the source region 3, and thus a resistance value thereof becomes higher than that of the source region 3. Forming such parasitic capacitance reduction regions 11 enables a depletion layer to be spread from the gate electrodes 21 to the source region 3 between the source electrode 15 and the gate electrodes 21, which makes it possible to reduce the gate-source capacitance $C_{GS}$. Note that other configurations are the same as those of the first embodiment, and detailed descriptions will be omitted.

[Method for Manufacturing Semiconductor Device]

Next, an example of a method for manufacturing the semiconductor device 100 according to the present embodiment will be described with reference to FIG. 6. However, only processes that differ from the manufacturing method described in the first embodiment will be described, and detailed descriptions of the same processes as in the first embodiment will be omitted.

Figure 6:
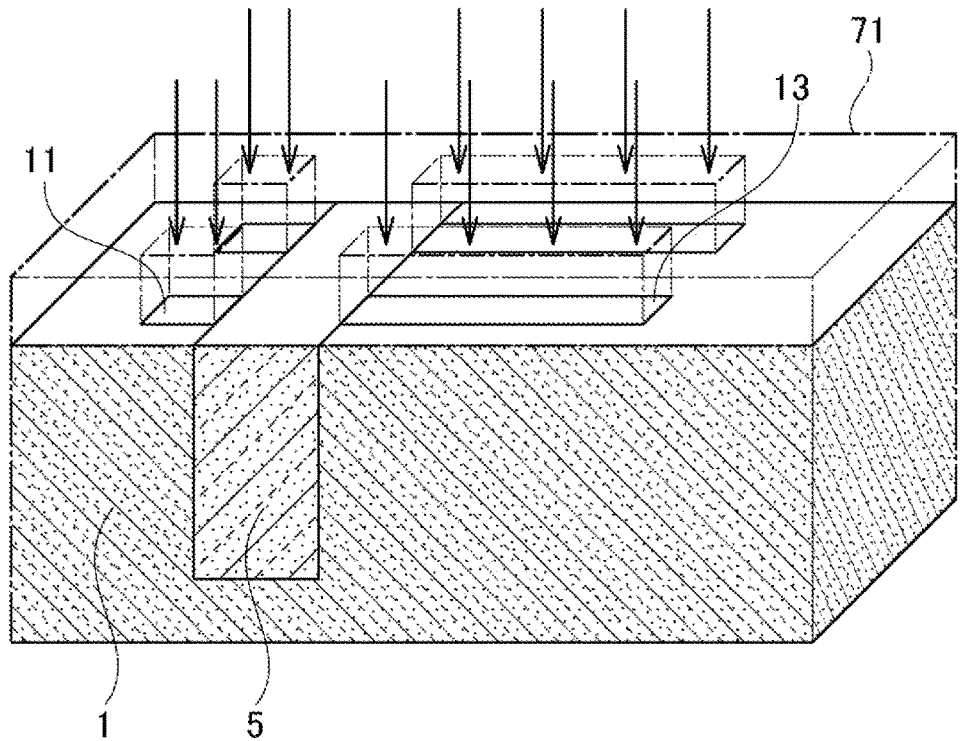
FIG. 6 is a schematic process diagram for illustrating a method for manufacturing the semiconductor device according to the second embodiment of the present invention.

After the well region 5 is formed on the substrate 1 in the same manner as in the first embodiment, as illustrated in FIG. 6, a mask material 71 formed on the substrate 1 and the well region 5 is patterned to expose a region where the parasitic capacitance reduction regions 11 and the column regions 13 are formed. Then, using the mask material 71 as a mask, ion implantation is performed to selectively dope a p-type impurity to the substrate 1 to form the parasitic capacitance reduction regions 11 and the column regions 13. Then, the semiconductor device 100 is completed in the same manner as in the first embodiment.

When the parasitic capacitance reduction regions 11 are formed from an n-type semiconductor material, a process for forming the parasitic capacitance reduction regions 11 may be provided separately from a process for forming the column regions 13. In the process, a mask material formed on the substrate 1 and the well region 5 is patterned to expose a region where the parasitic capacitance reduction regions 11 are formed, and ion implantation may be performed to dope an n-type impurity to the substrate 1 using the mask material as a mask.

Effects of Second Embodiment

As described above in detail, in the semiconductor device 100 according to the present embodiment, the parasitic capacitance reduction regions 11 are formed from an n-type semiconductor material having a lower impurity concentration than that of the source region 3. This enables a depletion layer to be spread from the gate electrodes 21 to the source region 3 between the source electrode 15 and the gate electrodes 21, thereby reducing the gate-source capacitance $C_{GS}$.

In the semiconductor device 100 according to the present embodiment, the parasitic capacitance reduction regions 11 are formed from a p-type semiconductor material having a lower impurity concentration than that of the source region 3. This enables a depletion layer to be spread from the gate electrodes 21 to the source region 3 between the source electrode 15 and the gate electrodes 21, which makes it possible to reduce the gate-source capacitance $C_{GS}$.

Third Embodiment

A third embodiment to which the present invention is applied will be described below with reference to the drawings. The same elements in the drawings are denoted by the same reference numerals, and descriptions thereof will be omitted.

[Structure of Semiconductor Device]

Figure 7:
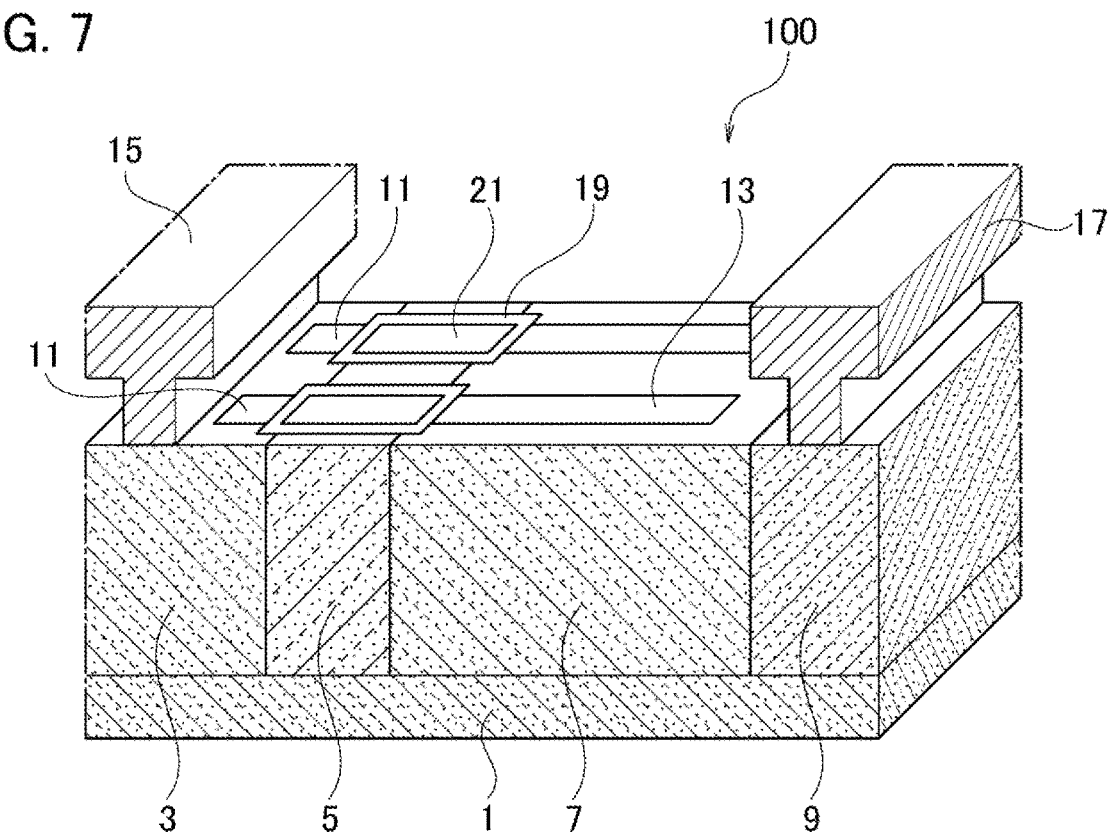
FIG. 7 is a cross-sectional perspective view illustrating a structure of a semiconductor device according to a third embodiment of the present invention.
Figure 8:
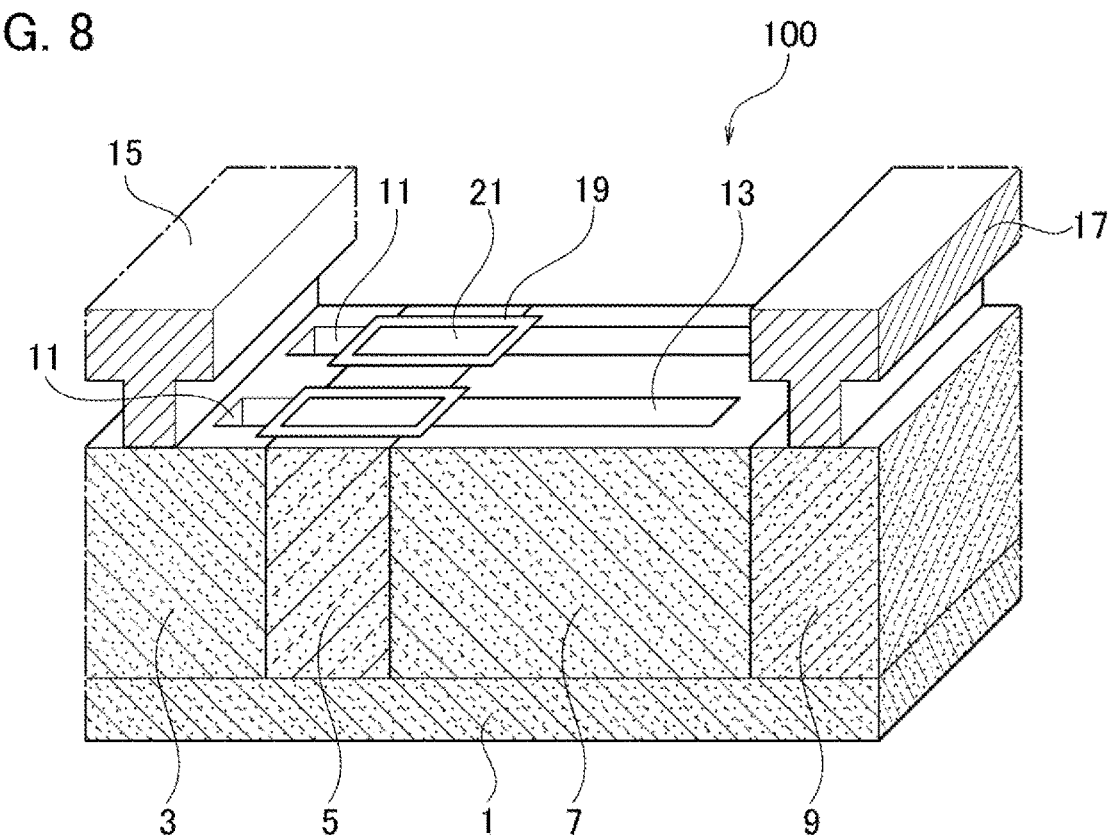
FIG. 8 is a cross-sectional perspective view illustrating a structure of the semiconductor device according to the third embodiment of the present invention.

FIG. 7 is a diagram illustrating a structure of a semiconductor device according to the present embodiment. As illustrated in FIG. 7, the semiconductor device 100 according to the present embodiment differs from the first embodiment in that the parasitic capacitance reduction regions 11 are formed from an insulating film. As illustrated in FIG. 8, the parasitic capacitance reduction regions 11 may be formed with grooves.

As described above, since the parasitic capacitance reduction regions 11 are formed from an insulating film, a resistance value thereof becomes higher than that of the source region 3. When the parasitic capacitance reduction regions 11 are grooves, the resistance value also becomes higher than that of the source region 3. Forming the parasitic capacitance reduction regions 11 with an insulating film in this manner causes a very small insulator capacitance to be sandwiched between the source electrode 15 and the gate electrodes 21, which makes it possible to reduce the gate-source capacitance $C_{GS}$. By forming the parasitic capacitance reduction regions 11 as grooves, the capacitance at both ends of the grooves becomes 0, which makes it possible to reduce the gate-source capacitance $C_{GS}$. Note that other configurations are the same as those of the first embodiment, and detailed descriptions will be omitted.

[Method for Manufacturing Semiconductor Device]

Figure 9A:
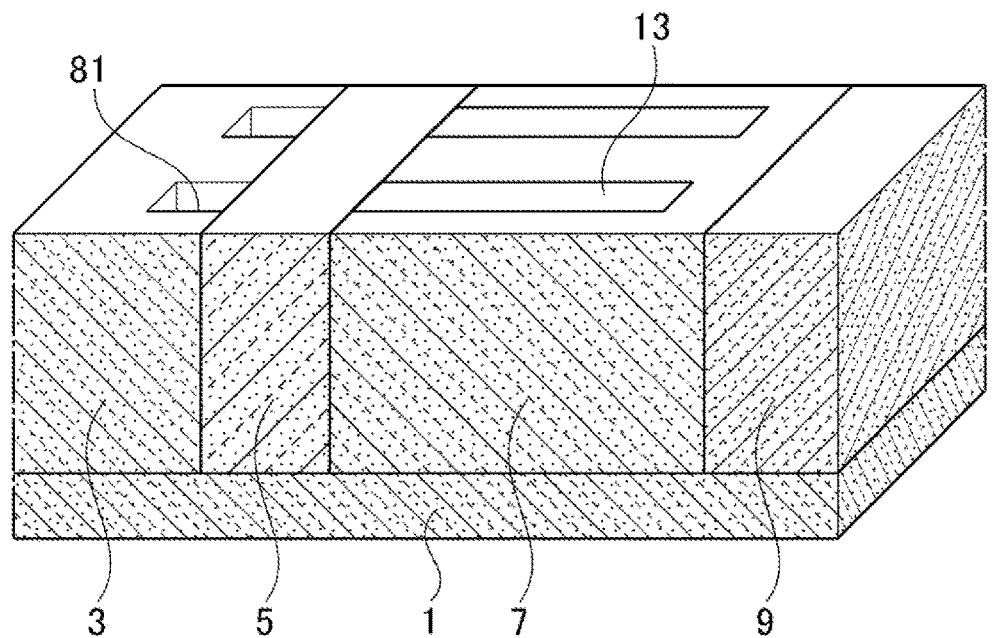
FIG. 9A is a schematic process diagram for illustrating a method for manufacturing the semiconductor device according to the third embodiment of the present invention (No. 1).

Next, an example of a method for manufacturing the semiconductor device 100 according to the present embodiment will be described with reference to FIGS. 9A to 9B. However, only processes that differ from the manufacturing method described in the first embodiment will be described, and detailed descriptions of the same processes as in the first embodiment will be omitted.

A mask material is grown after the well region 5, the column regions 13, the drift region 7, the source region 3, and the drain region 9 are formed on the substrate 1 in the same manner as in the first embodiment. A resist is patterned on the mask material, and part of the source region 3 is selectively etched with dry or wet etching to form grooves 81 in which the parasitic capacitance reduction regions 11 are embedded, as illustrated in FIG. 9A. Consequently, the grooves 81 are formed at a position in contact with the source region 3 and the well region 5.

Figure 9B:
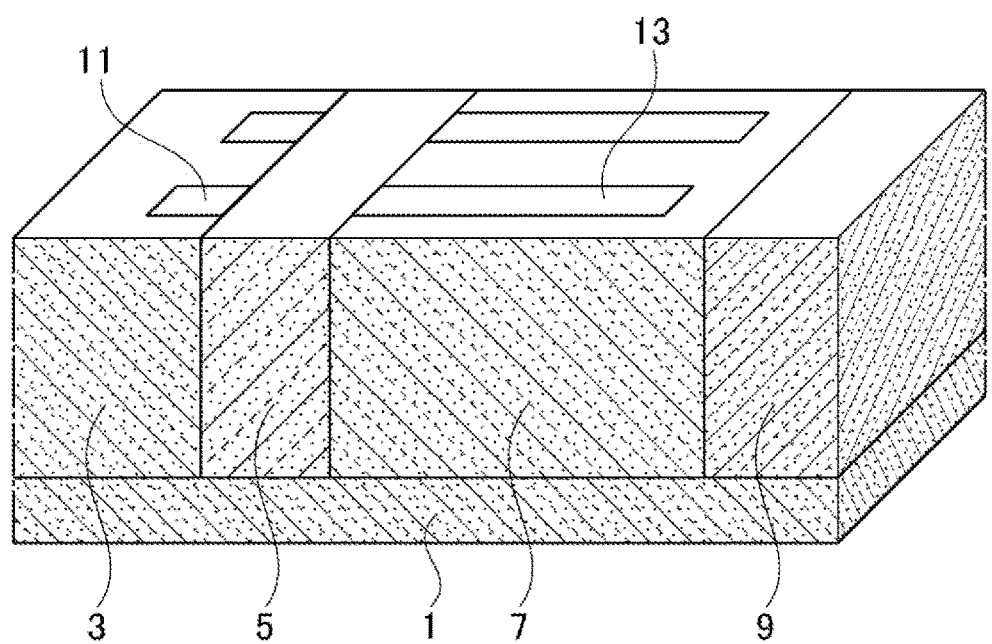
FIG. 9B is a schematic process diagram for illustrating the method for manufacturing the semiconductor device according to the third embodiment of the present invention (No. 2).

Then, as illustrated in FIG. 9B, insulating films 83 are formed inside the grooves 81. The insulating films 83 are grown to a thickness sufficient to fill the grooves 81. In the present embodiment, a silicon oxide film is used as the insulating films 83, but a silicon nitride film may be used. Then, flattening is performed with dry or wet etching, and the parasitic capacitance reduction regions 11 are formed, which are silicon oxide films embedded in the grooves 81. Then, the semiconductor device 100 is completed in the same manner as in the first embodiment. Note that when the parasitic capacitance reduction regions 11 are grooves, the method may proceed to a process of forming the gate electrodes 21 while leaving the grooves 81 without forming the insulating films 83.

Effects of Third Embodiment

As described above in detail, in the semiconductor device 100 according to the present embodiment, the parasitic capacitance reduction regions 11 are formed with the insulating films 83. This causes a very small insulator capacitance to be sandwiched between the source electrode 15 and the gate electrodes 21, which makes it possible to reduce the gate-source capacitance $C_{GS}$.

In the semiconductor device 100 according to the present embodiment, the parasitic capacitance reduction regions 11 are formed with the grooves 81. This enables the capacitance at both ends of the grooves 81 to be 0, which makes it possible to reduce the gate-source capacitance $C_{GS}$.

Note that the embodiments described above are examples of the present invention. Thus, it should be understood that the present invention is not intended to be limited to these embodiments, and various modification can be made, in addition to the embodiments described above, according to designs and the like without departing from the scope of the technical idea of the present invention.

REFERENCE SIGNS LIST

1 Substrate
3 Source region
5 Well region
7 Drift region
9 Drain region
11 Parasitic capacitance reduction region
13 Column region
15 Source electrode
17 Drain electrode
19 Gate insulating film
21 Gate electrode
51, 53, 55, 57, 71 Mask material
59 Gate groove
61 Gate wiring
63 Interlayer insulating film
65 Source electrode contact hole
67 Drain electrode contact hole
81 Groove
83 Insulating film

The invention claimed is:

1. A semiconductor device comprising:
 a substrate;
 a first conductivity type source region formed on a main surface of the substrate;
 a second conductivity type well region formed on the main surface of the substrate and electrically connected to the first conductivity type source region;
 a first conductivity type drift region formed on the main surface of the substrate and in contact with the second conductivity type well region;
 a first conductivity type drain region formed on the main surface of the substrate and in contact with the first conductivity type drift region;
 a first electrode electrically connected to the first conductivity type source region;
 a second electrode electrically connected to the first conductivity type drain region;
 a third electrode formed in contact with the first conductivity type source region, the second conductivity type well region, and the first conductivity type drift region through an insulating film; and
 a parasitic capacitance reduction region formed in contact with the first conductivity type source region and in contact with the third electrode through the insulating film, the parasitic capacitance reduction region having a higher resistance value than that of the first conductivity type source region.

2. The semiconductor device according to claim 1, wherein the parasitic capacitance reduction region is formed from a material same as that of the substrate.

3. The semiconductor device according to claim 1, wherein the parasitic capacitance reduction region is formed from a first conductivity type semiconductor material having a lower impurity concentration than that of the first conductivity type source region.

4. The semiconductor device according to claim 1, wherein the parasitic capacitance reduction region is formed from a second conductivity type semiconductor material having a lower impurity concentration than that of the first conductivity type source region.

5. The semiconductor device according to claim 1, wherein the parasitic capacitance reduction region is formed from an insulating film.

6. The semiconductor device according to claim 1, wherein the parasitic capacitance reduction region is a groove.

7. The semiconductor device according to claim 1, wherein the substrate is an insulation substrate.

8. The semiconductor device according to claim 1, wherein the parasitic capacitance reduction region is formed from a surface of the first conductivity type source region to a depth of the substrate.

9. The semiconductor device according to claim 1, wherein the substrate is made from silicon carbide.

10. The semiconductor device according to claim 1, wherein the second conductivity type well region and the first conductivity type drift region are made from a wide bandgap semiconductor.

11. The semiconductor device according to claim 1, wherein the substrate is made from a material same as that of the first conductivity type drift region.

12. A method for manufacturing the semiconductor device according to claim 1, comprising:
  doping an impurity to the substrate using ion implantation to form the first conductivity type source region, the second conductivity type well region, the first conductivity type drift region, and the first conductivity type drain region.

13. The method according to claim 12, wherein the first conductivity type source region, the second conductivity type well region, the first conductivity type drift region, and the first conductivity type drain region are formed through changing an impurity concentration in a depth direction during the ion implantation.

14. The method according to claim 12, wherein when the first conductivity type source region is formed using ion implantation, part of a region where the first conductivity type source region is formed is masked and thus the parasitic capacitance reduction region is formed.

* * * * *